US010050399B1

(12) United States Patent
Moen et al.

(10) Patent No.: US 10,050,399 B1
(45) Date of Patent: Aug. 14, 2018

(54) CONNECTION PANEL AND METHODS FOR DECREASING SERVICE TIME FOR SERVER RACK NETWORK DEVICES

(71) Applicant: Amazon Technologies, Inc., Seattle, WA (US)

(72) Inventors: Michael Jon Moen, Olympia, WA (US); Max Jesse Wishman, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/654,288

(22) Filed: Jul. 19, 2017

Related U.S. Application Data

(63) Continuation of application No. 14/589,893, filed on Jan. 5, 2015, now Pat. No. 9,722,381.

(51) Int. Cl.
| | |
|---|---|
| *G06F 1/16* | (2006.01) |
| *H01R 33/88* | (2006.01) |
| *H01R 43/26* | (2006.01) |
| *H01R 13/73* | (2006.01) |
| *H01R 24/76* | (2011.01) |

(52) U.S. Cl.
CPC ......... *H01R 33/88* (2013.01); *G06F 1/1632* (2013.01); *H01R 13/73* (2013.01); *H01R 24/76* (2013.01); *H01R 43/26* (2013.01)

(58) Field of Classification Search
CPC .................................................. G06F 1/1632
USPC .................................................... 361/679.45
See application file for complete search history.

(56) References Cited

U.S. PATENT DOCUMENTS

| | | |
|---|---|---|
| 5,460,547 A | 10/1995 | Belt et al. |
| 6,321,340 B1 | 11/2001 | Shin et al. |
| 6,347,963 B1 | 2/2002 | Falkenberg et al. |
| 6,558,201 B1 | 5/2003 | Begley et al. |
| 6,796,844 B1 | 9/2004 | Edwards, III |
| 7,335,033 B1 | 2/2008 | Edwards, Jr. et al. |
| 7,934,959 B2 | 5/2011 | Rephaeli et al. |
| 7,976,346 B2 | 7/2011 | Guy et al. |

(Continued)

OTHER PUBLICATIONS

Installing and Removing SFP and SFP+ Transceiver Modules, HP Consumer Support, downloaded from "http://h10025.www1.hp.com/ewfrf/wc/document?docname=c03421066&cc=us&dlc+en . . . " on Nov. 17, 2014, 7 pages.

(Continued)

*Primary Examiner* — Adrian S Wilson
(74) *Attorney, Agent, or Firm* — Klarquist Sparkman, LLP

(57) ABSTRACT

A connection panel for enabling quick change over of a network device comprises a body and an engaging device. An exterior side of the body has multiple sockets, each of which can receive a plug connector. The panel is configured for positioning at one end of a rack space for the network device. The panel's interior side has first network device connections configured to mate with second network device connections on the network device. The engaging device has at least one member extending between the network device and the panel, and is repositionable between at least an engaged position in which the network device is moved towards and mechanically coupled to the panel with the second network device connections urged into engagement with and electrically connected to the first connections, and a disengaged position in which the network device is disengaged from the panel and removable from the rack space.

20 Claims, 7 Drawing Sheets

(56) References Cited

U.S. PATENT DOCUMENTS

| | | |
|---|---|---|
| 8,392,575 B1 | 3/2013 | Marr |
| 8,416,565 B1 | 4/2013 | Ross |
| 8,419,444 B2 | 4/2013 | Kagan et al. |
| 8,477,491 B1 | 7/2013 | Ross et al. |
| 8,537,558 B2 | 9/2013 | Su et al. |
| 8,655,137 B2 | 2/2014 | Baldassano et al. |
| 8,804,538 B1 | 8/2014 | Higgins et al. |
| 9,285,831 B2 | 3/2016 | Vroom et al. |
| 2009/0257754 A1 | 10/2009 | Theodoras, II et al. |
| 2011/0222819 A1 | 9/2011 | Anderson et al. |
| 2012/0077388 A1 | 3/2012 | Mei et al. |
| 2013/0237092 A1 | 9/2013 | Rubens |
| 2014/0037259 A1 | 2/2014 | Bragg |

OTHER PUBLICATIONS

Cisco SPF Connector drawing, undated, 1 page.

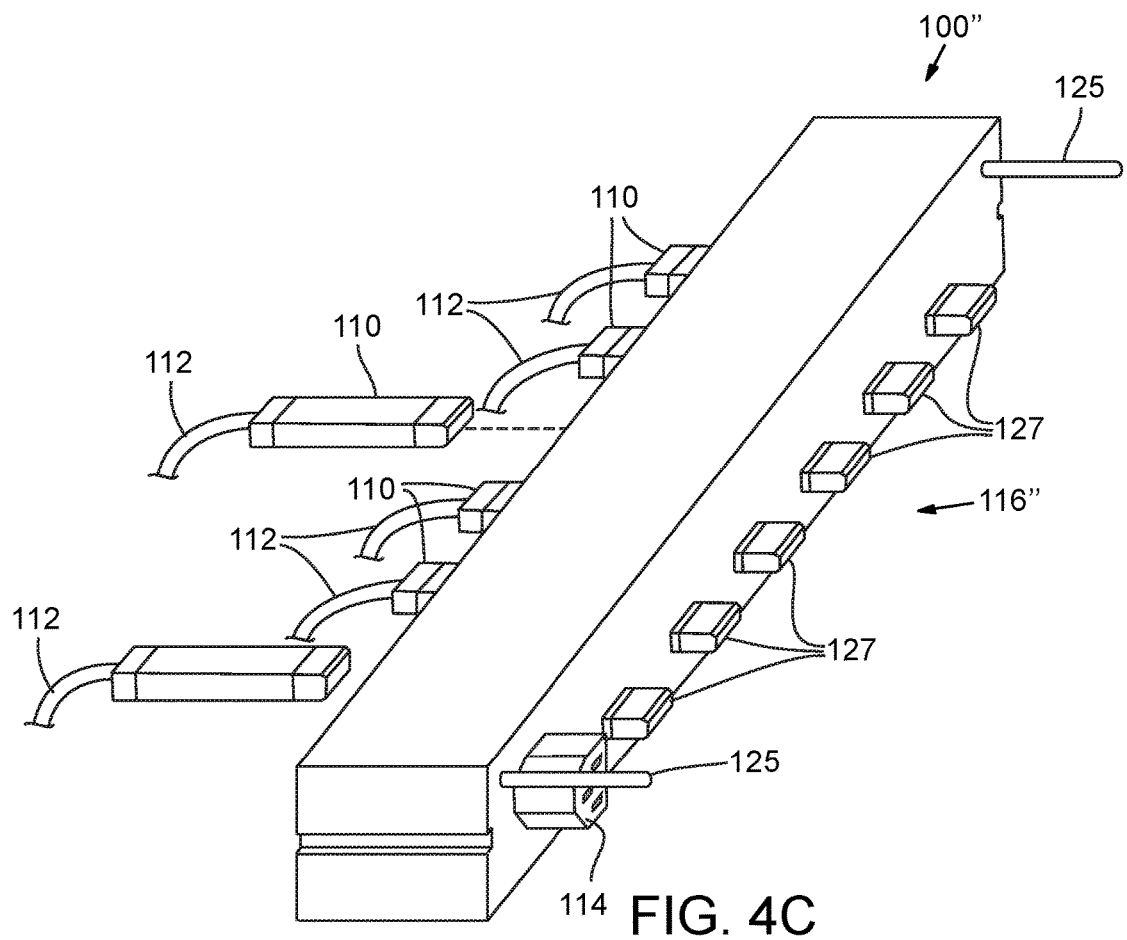
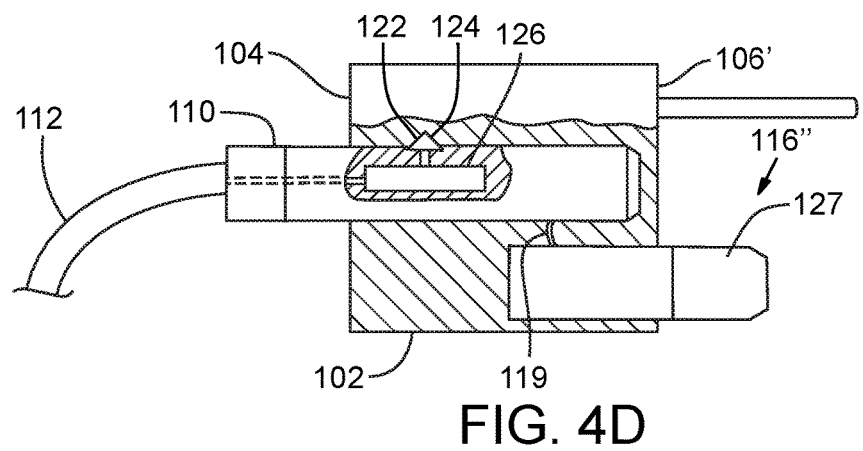

US 10,050,399 B1

CONNECTION PANEL AND METHODS FOR DECREASING SERVICE TIME FOR SERVER RACK NETWORK DEVICES

CROSS REFERENCE TO RELATED APPLICATION

This is a continuation of U.S. patent application Ser. No. 14/589,893, filed Jan. 5, 2015, which application is incorporated herein in its entirety.

BACKGROUND

Data centers and other similar installations include racks or cabinets of different network devices that are typically interconnected by cords, cables or other similar connections. In the case of a server rack, one type of network device is a top of rack switch that establishes a connection to internal and/or external networks, including connections for the other network devices of the rack. Top of rack switches can fail or otherwise require changing out, such as for maintenance or repair. Typically, there is no redundancy for the functionality of a top of rack switch, so reducing downtime in changing out the switch is advantageous. But the switch can have 10, 20 or even a greater number of cords connected to it, and each of these cords needs to be unplugged from the current switch and plugged into the correct location in the new switch, which is time consuming.

BRIEF DESCRIPTION OF THE DRAWINGS

FIG. 4C is a perspective view showing the interior side of the second connection panel according to another implementation.

FIG. 4D is a section view in elevation of the panel of FIG. 4C showing a separate SFP+ connector connected to the plug connector and extending from an interior side.

DETAILED DESCRIPTION

Described below are implementations of a connection member, referred to as a connection panel, and associated methods used in making quick changeovers of electronic components having multiple individually wired connections, such as network devices in a server rack (including servers, switches and other components). An exterior side of the panel has multiple sockets, each shaped to receive a plug connector for one of the wired connections. The opposite or interior side of the panel has first network device connections configured for mating with second network device connections on one of the network devices, such as a server, switch or other network device. The first network device connections on the interior side of the panel are defined by protruding ends of the plug connectors positioned to extend through the panel, or as separate connections electrically connected to the plug connectors. Such separate connections can be protruding circuit board connectors configured for connection to edge connectors on the network device or protruding plug connectors (of the same or a different type), which are described below in more detail, or another suitable type of connector.

During use, the panel is fixed in place at one end of a slot or space in the rack for the corresponding network device (such as adjacent the front side of the rack). There is a panel engaging device on the network device having a member engageable with the panel to move the network device into its installed position and to urge the second connections on the network device together with the first connections on the panel. When the network device needs to be removed for replacement or service, the panel engaging device is released, and the network device can then be removed from the slot in the rack, typically from the rear side of the rack, while the panel remains in place with the plug connectors engaged with the connection panel. A replacement or repaired network device need only be inserted into the slot and re-engaged with the connection panel. Because there is no need to disengage and remove each plug connector from the network device, considerable time is saved and the potential for mis-wiring is avoided.

Figure 1:
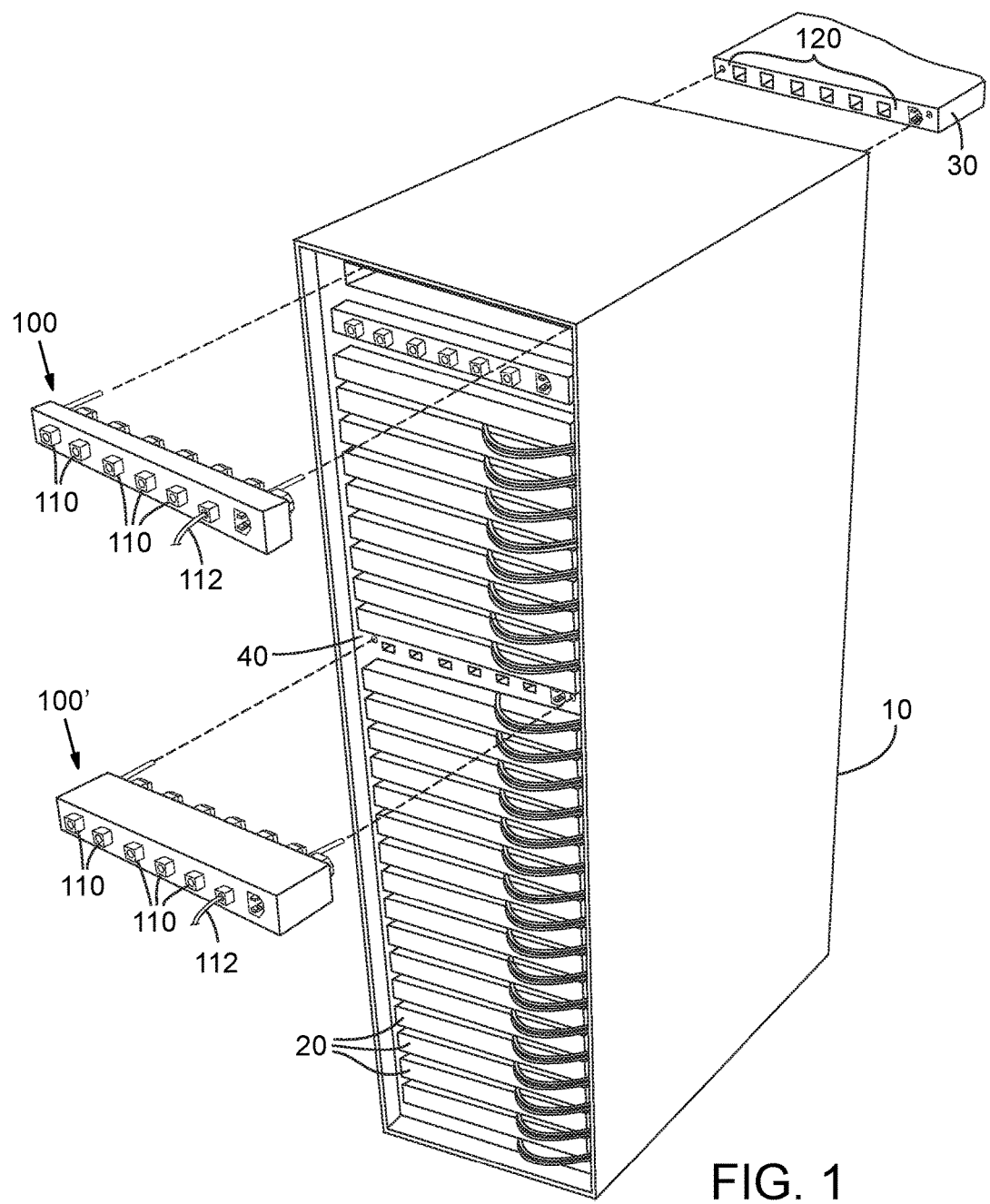
FIG. 1 is a perspective view of top, front and left sides of a typical server rack cabinet showing a top of rack switch being readily removed from the rear of the rack through use of a new first connection panel, as well as a new second connection panel for use with another network device (the connection panels are shown removed from their installed positions for the sake of illustration).

FIG. 1 is a perspective view of a server rack, such as a conventional 19-inch rack, having a cabinet 10 for holding multiple server computers 20 (also called servers or host devices), one or more top of rack switches 30, one or more other switches 40 and/or other similar network device(s) in a stacked arrangement. At least some of the network devices in a typical server rack are electrically connected to other network devices in the same rack or in another location by cables or cords, typically with ends having plug connections allowing for repeated insertion and removal (portions of representative patch cords 112 are shown in FIG. 1 for the sake of illustration). There is a connection panel 100 according to a first type shown for the sake of illustration spaced from its installed position at a forward end of a top slot for a first network device, which in this case is a top of rack switch 30. The top of rack switch 30 is shown immediately after having been disengaged from the panel 100 and removed from a rear side of the slot. Immediately below, a second instance of the connection panel is shown in the second position in the rack to illustrate the installed position of the connection panels. The connection panels can be held in place using any suitable approach, such as, e.g., conventional EIA plates. At an intermediate rack position, there is a connection panel 100' according to a second type shown in relation to a second network device, in this case, a switch 40.

Figures 2A, 2B:
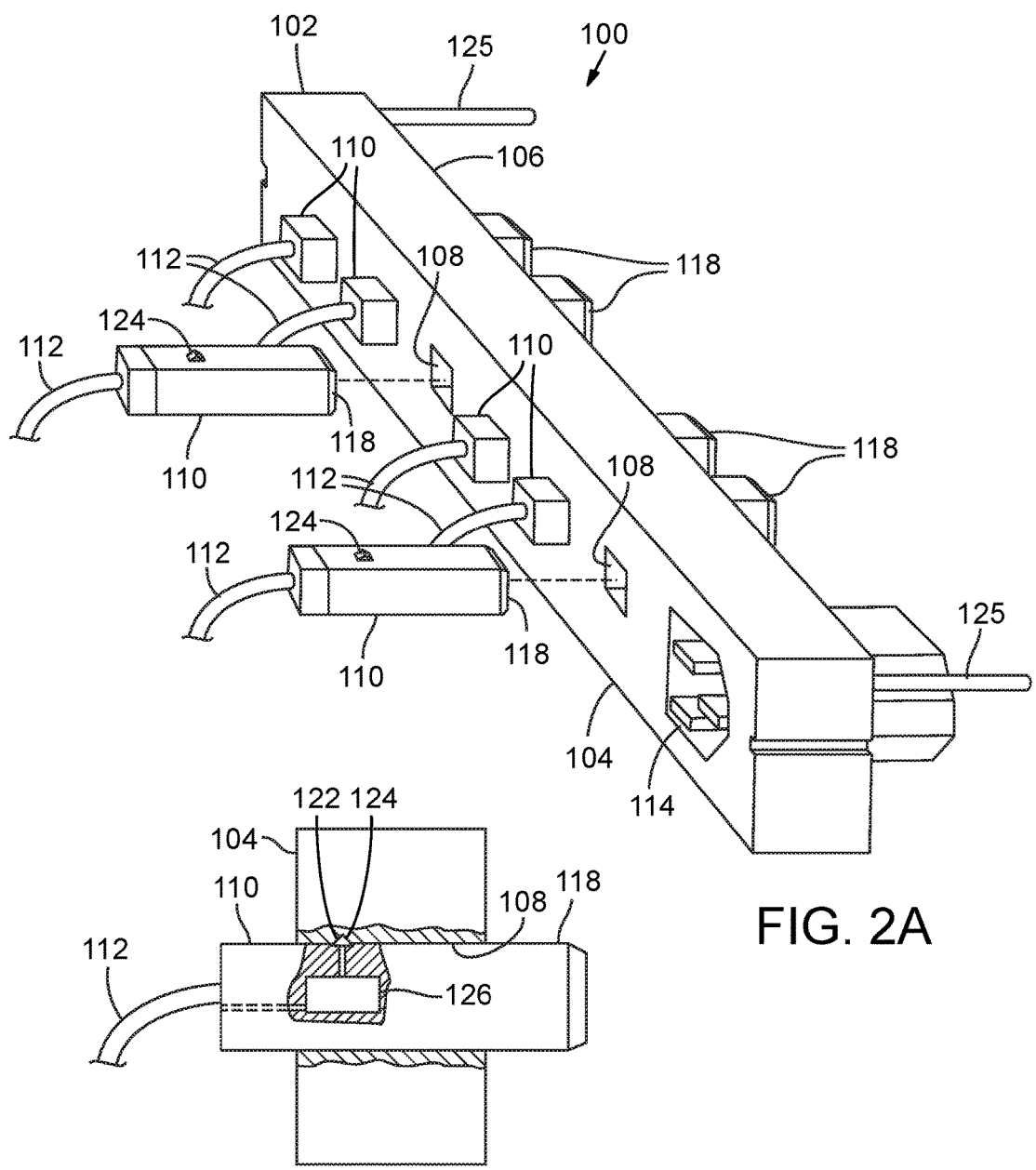
FIG. 2A is a perspective view showing the exterior side of the first connection panel of FIG. 1, and several connections to the panel.
FIG. 2B is a section view in elevation of the panel of FIG. 2A showing a plug connector extending through a socket.
Figure 3:
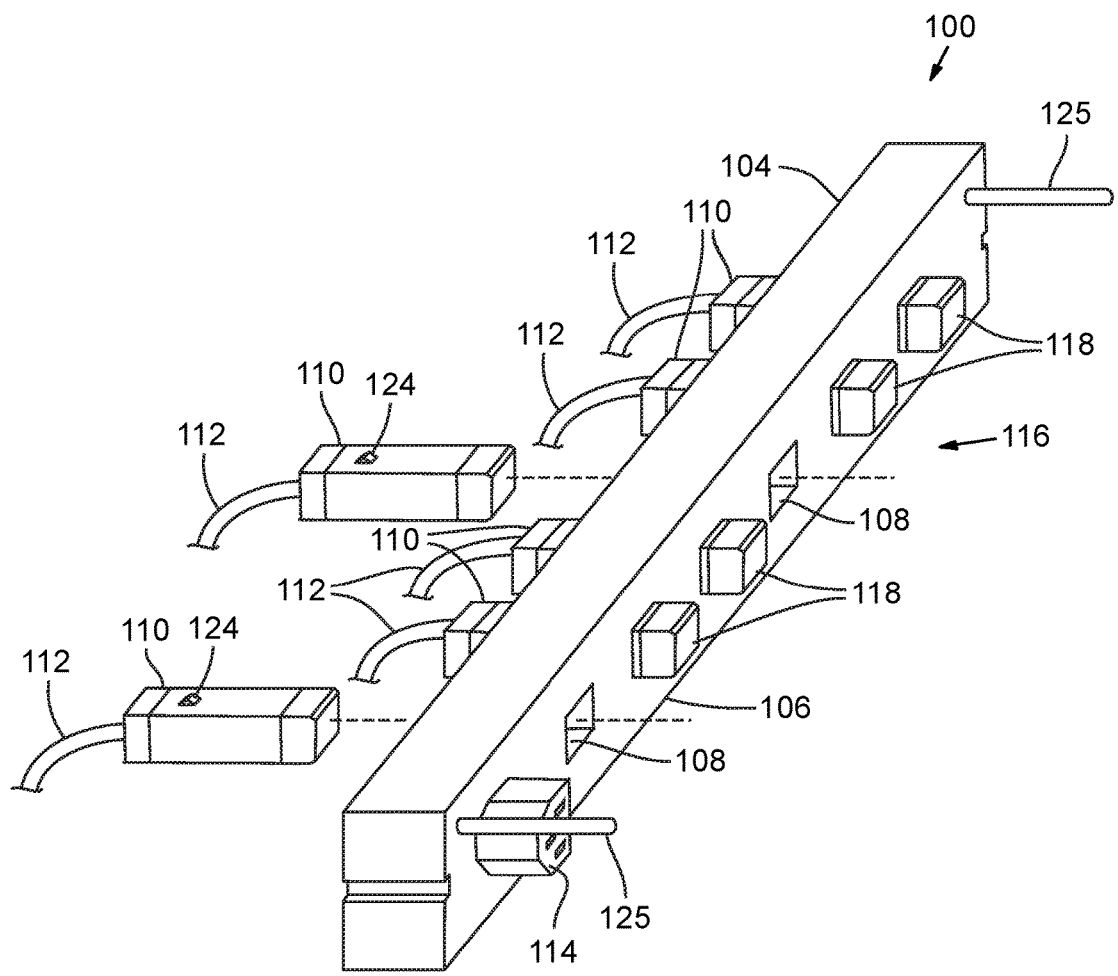
FIG. 3 is a perspective view showing the interior side of the first connection panel.

Referring to FIGS. 2A, 2B and 3, the connection panel 100 is illustrated in more detail (the connection panel 100' is similar in many respects, and its different characteristics are described below). The connection panel 100 has a body 102 with an exterior side 104 (visible in FIGS. 1 and 2A) and an interior side 106 (visible in FIG. 3). On the exterior side 104, multiple sockets 108 are defined to receive plug connectors 110 at the ends of respective patch cords. In FIG. 1, there are six plug connectors received in six corresponding sockets. In the enlarged perspective view of FIG. 2A, four plug connectors 110 are shown inserted in four of the sockets 108, and two of the plug connectors 110 are shown spaced apart from their respective sockets 108, e.g., as they would be positioned directly before they are inserted or removed. Each of the connectors 110 extends from a flexible cord 112 and forms the end of a patch cord.

In the panel 100, the plug connectors 110 extend through the sockets 108 and protrude from the interior side 106, as shown in FIGS. 2A and 3. Protruding ends 118 of the plug connectors 110 form first network device connections 116 on the panel 100. These first network device connections 116 are designed to connect with second network device connections 120 (FIGS. 1 and 5) on the network device.

In the illustrated implementations, the plug connectors 110 are conventional plug connections, but the panel 100, the sockets 108 and the other structural elements could be configured to work with a plug connections having one or more custom configurations. In the illustrated implementations, the plug connectors 110 are conventional SFP+ connectors, also called modules, having an outer housing with a length several times greater than a major dimension of its cross section, which is generally rectangular. SFP+ connections are enhanced small form-factor pluggable connections for transceiver modules. Conventional SFP+ connectors and cables are available from a number of different suppliers, including Molex and Cisco, among others.

An SFP+ connector or module typically has a retainer mechanism operable to retain it in a receiving socket on a network device. As is well known, the retainer can comprise one or more teeth or tabs that protrude from one of the sides of the module to engage with one or more corresponding recesses in the receiving socket to retain the module in position and prevent it from being pulled or pushed longitudinally. The teeth or tabs can be withdrawn from their protruding position to allow the module to be moved longitudinally and removed from the socket. The retainer also comprises an actuator, such as a latch, clasp, bail, button, pull tab or other element, that is manually actuatable by a user, to move the teeth or tabs or otherwise disengage the module from the socket and allow it to be removed.

Although the top of rack switch 30 has been shown with only six sockets for clarity, other top of rack switches may have 10, 20 or even more sockets, and each socket may be occupied by a required plug connector. As described, in the case of SFP+ modules and most other similar connector technologies, removing the plug connector requires manually actuating an actuator, such as of one of the types described above. Changing out the top of rack switch requires disengaging and re-engaging each plug connector, and thus may require 20, 40 or even more manipulations, which can take a trained operator five minutes or more, especially to ensure that all connections are made completely and accurately. In the case of the top of rack switch in some network configurations, this can mean a loss of connectivity for five minutes or more, which can be problematic.

Using the panel 100, 100', however, requires far fewer operations and thus allows for much faster changeovers of a switch or other network device. Instead of individually disengaging each plug connector from each socket of the network device and then individually re-engaging it with the new network device, the panel 100, 100' is disengaged from the network device, and then the panel is re-engaged with the replacement network device, with the plug connectors 110 remaining engaged with the panel throughout the process. Thus, the plug connectors do not need to be disengaged and removed and then inserted and re-engaged.

FIG. 2B is a section view in elevation showing one of the plug connectors 110 engaged in one of the sockets 108 of the panel 100. The socket 108 is configured to have one or more recesses 122 configured to receive one or more projections 124 of the plug connector 110. The projections 124 may be biased toward the engaged position as shown in which they protrude from the plug connector and extend into the recess. The projections 124 are movable to a disengaged position in which they are retracted within the plug connector 110 by actuation of an actuator, which is shown schematically at block element 126. In this way, the plug connectors 108 can be connected to and removed from the connection panel 100, 100' in the same way they are connected and removed from a conventional network device.

Figure 4A:
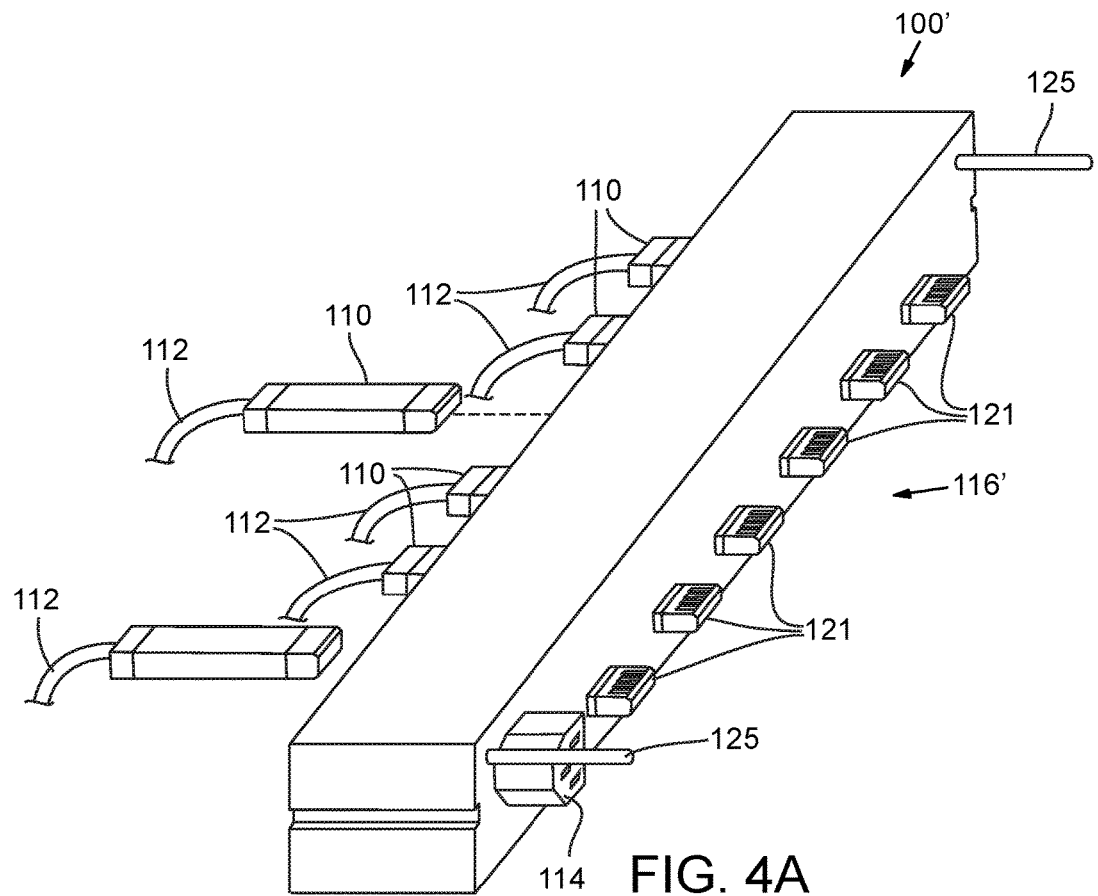
FIG. 4A is a perspective view showing the interior side of the second connection panel.
Figure 4B:
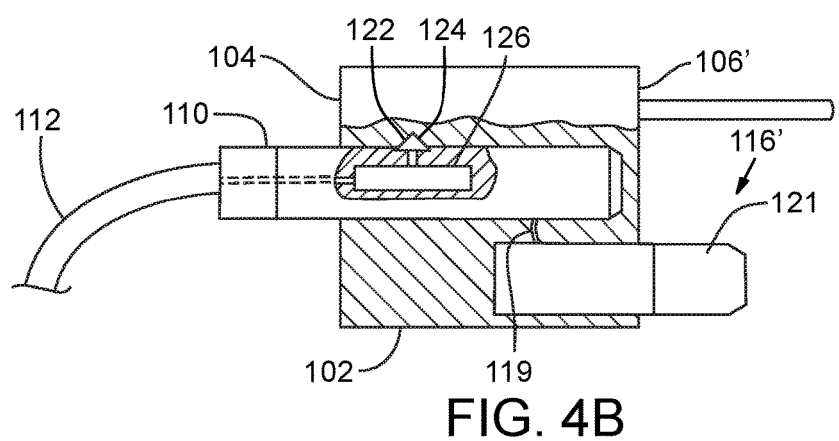
FIG. 4B is a section view in elevation of the panel of FIG. 4A showing a separate connector connected to the plug connector and extending from an interior side.

FIG. 4A is a perspective view showing the interior side of the connection panel 100', which has a different configuration that the interior side of the connection panel 100. In the connection panel 100', the first network device connections 116' are separate connectors that are fixed in place in or on the interior side 106'. The first network device connections 116' are electrically connected to any corresponding plug connectors 100 present in the corresponding sockets 108 by an internal conductor(s), which is shown schematically at 119 in FIG. 4B within the panel 100'. In the illustrated implementation, the first network device connections 116' can be projecting edge connectors 121 of a circuit board, as one example. Correspondingly, the second network device connections on the network device can be edge sockets (not shown) configured to receive the edge connectors 121. The panel 100' can have a greater depth dimension than the panel 100 as shown, or other geometries can be implemented. Circuit board edge connections are advantageous because they are fairly inexpensive to implement and durable, but other types of connections could also be used to achieve the same result. It would be possible to implement a connection panel that has some connections made according to the panel 100 approach and others according to the panel 100' approach.

FIG. 4C is a perspective view showing the interior side of a connection panel 100", which is similar to the connection panel 100' of FIG. 4A, but has first network connections 116" that are separate connectors of the SFP+ type instead of the edge connector type. Thus, the projecting connectors 127 have the same general geometry as at least the ends of the plug connectors 110. As shown in FIG. 4D, the projecting connectors 127 are electrically connected to the plug connectors 110 by the internal conductors 119, similar to the connection panel 100' shown in FIGS. 4A and 4B.

Figure 5:
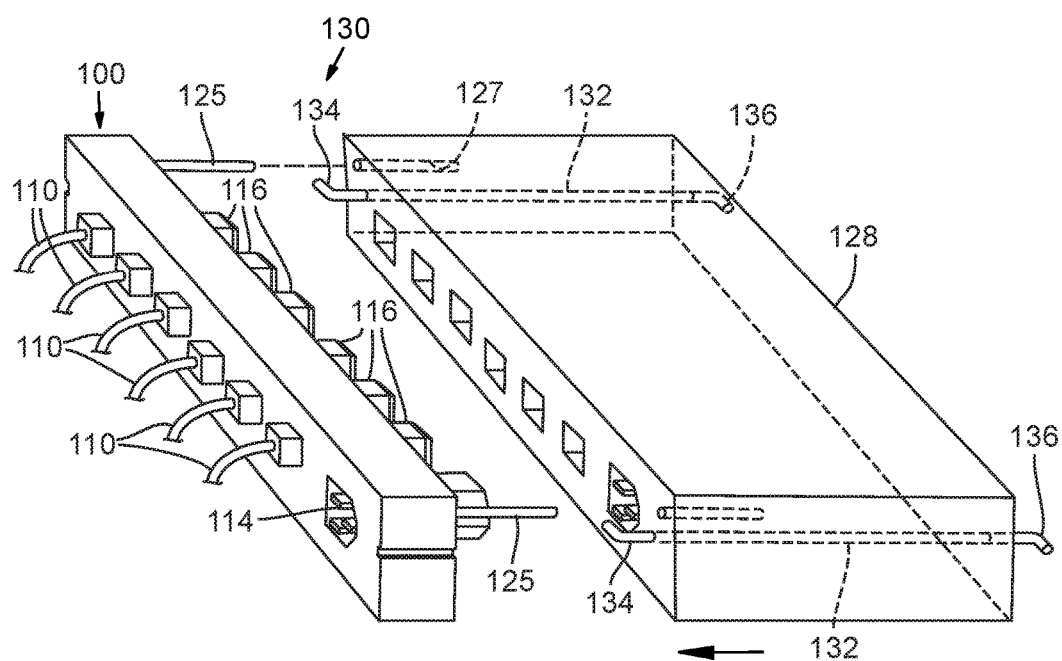
FIG. 5 is a perspective view showing a connection panel in relation to a panel engaging device extending from a switch for connecting the connection panel to the switch.

FIG. 5 is a perspective view of the panel 100 in relation to a network device 128 to show one representative implementation of a panel engaging device 130 operable to engage and disengage the network device from the panel. Although FIG. 5 illustrates the configuration of the connection panel 100, the same approach to the panel engaging device 130 can be used for the panel 100', the panel 100" and other panels. Engaging the network device 128 with the panel 100 is understood to mean aligning it, moving it toward the panel 100, and establishing electrical connections between the second connections on the network device and the corresponding first connections on the panel, which typically entails urging the first and second connections together to overcome some minimal assembly force (and/or structural engagement) to secure them together. In the illustrated implementation, the panel engaging device 130 has a member 132 configured to span a space between the network device 128 and the panel 100 and to be manually actuatable to exert a force to urge them together. As illustrated, the member 132 extends from the network device 128 towards the connection panel 100 and has an engaging end 134 engageable with the panel, such as in a recess formed in the panel. An actuating end 136 of the member 132 on an opposite side of the network device 128 is accessible by a user.

If the member 132 is configured as a cam member as shown, then the user manipulates the actuating end 136 (such as by rotating it or pivoting it) to cause the engaging end 134 to engage the panel 100 and draw the network device 128 towards the panel or to disengage the network device and allow it to be removed. In the illustrated implementation, the panel engaging device 130 includes two separate members 132, but one member or more than two members could be used, depending upon the specific requirements. If more than one member is used, each can be separately actuated, or the device can be configured with a single actuating element. In any event, the panel engaging device 130 serves to allow the network device 128 to be disengaged and removed, thereby permitting a replacement network device to be substituted, with far fewer manual operations and without requiring each plug connector 110 to be removed and then re-inserted.

In other implementations, the panel engaging device may be connected to the rack or other stationary network device (instead of or in conjunction with being connected to the network device).

As shown in the figures, the panel 100 may include one or more guide pins 125. The guide pins 125 may be positioned at side edges of the panel 100 as shown. The guide pins 125 are preferably dimensioned to project at least slightly beyond the next longest projection from the interior surface 106 of the connection panel. In this way, the guide pins 125 can be positioned in guide pin apertures 127 in the network device 128 to facilitate aligning the network device 128 with the panel 100 before the first and second connections contact each other. It would of course be possible to reverse the positions of the guide pins and guide pin apertures, as well as to implement different complementary guide structures. For example, there may be additional guiding and/or alignment features, such as chamfered surfaces on the connectors and/or connection panel, drawer slide rail surfaces to guide the connection panel into engagement with the network device, as well as other similar features, some of which are discussed in greater detail below.

In addition to the sockets 108, the panel can have one or more optional power sockets, with one such power socket 114 being shown in the figures. The power socket 114 can be a conventional IEC C13 power socket as shown or any other appropriate power connection.

Figure 6:
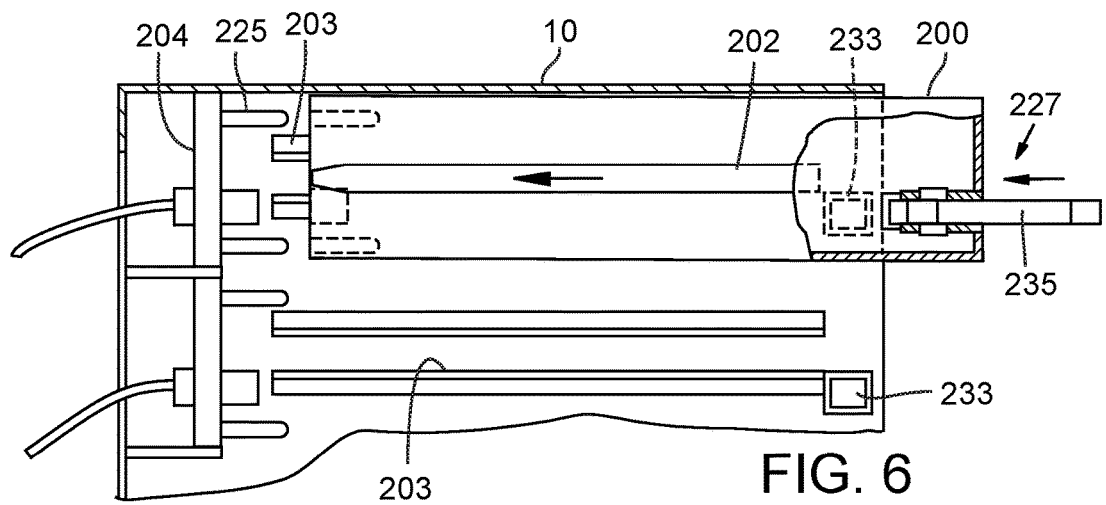
FIGS. 6-8 are side, top and rear views, respectively, showing a portion of a network component being installed into a rack space and having a cam arrangement for moving the network component into engagement with a connection panel mounted at an opposite end of the rack space.
Figure 7:
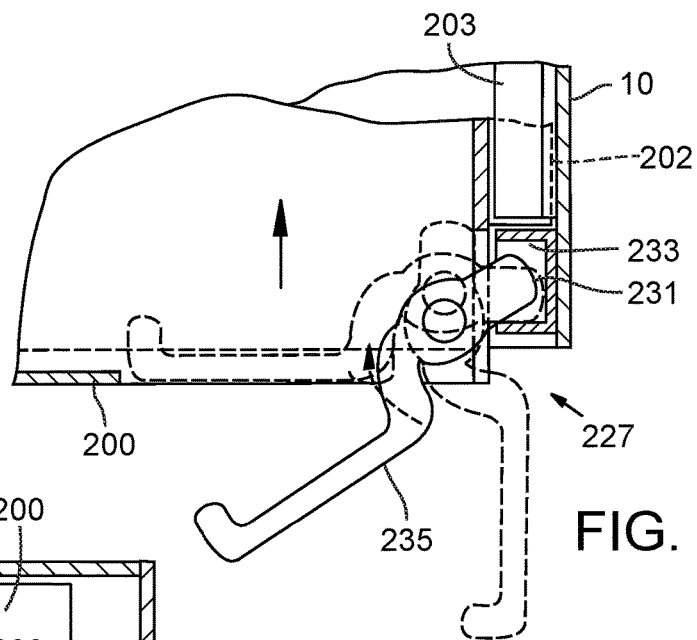
Figure 8:
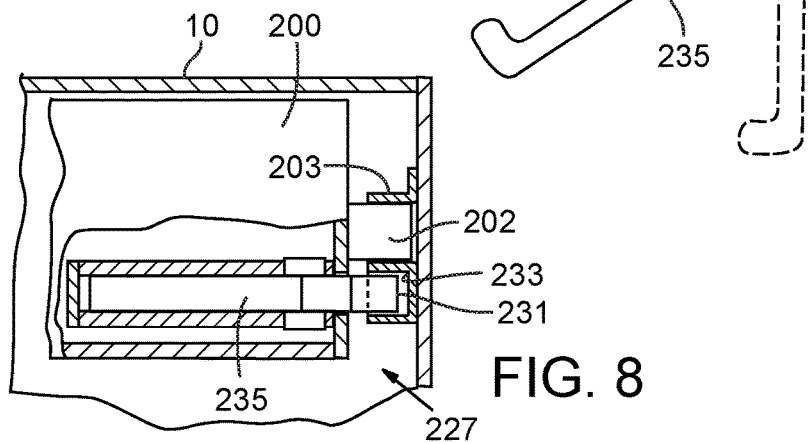

As shown in FIGS. 6-8, a network device 200 may be provided with rough alignment rails 202 along its opposite sides and sized to engage a corresponding groove or slot, referred to herein as a pocket 203 (FIGS. 6 and 8), in the rack space for the network device 200. The network device 200 is slid into place along the rough alignment rails 202 in the direction of the arrow, and then guide pins 225 (if present) of the panel 204 are received, before the panel engaging device 227 is engaged to couple the network device 200 and the panel 204 together. As best shown in FIG. 7, which is a view from above, the panel engaging device 227 can take the form of a cam 229 coupled to the network device 200 that has a distal engaging end 231 shaped to engage the rack or other stationary structure, such as through an opening 233 in the in the pocket 203. The cam also has a hand lever 235 to allow a user to actuate it, and to exert sufficient force to engage/disengage multiple connectors. The hand lever 235 can be shaped as shown to have a storage position as shown in dashed lines within the plan of the network device 200, including an optional locked position.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A network device of a server rack configured to enable quick change over of plug connectors, the network device comprising:
 a body having alignment rails positioned on opposite side surfaces and configured for engaging respective pocket members formed in a rack space of the server rack; and
 an engaging device on the body having a camming member with an engaging end movable into engagement with the server rack to move the network device into the rack space and urge multiple connections on the network device into engagement with connections on a panel in the rack space.

2. The network device of claim 1, wherein the camming member comprises a handle end actuatable by a user to engage and disengage the cam.

3. The network device of claim 1, wherein the engaging end is shaped to engage an opening in the pocket member of the server rack.

4. The network device of claim 1, wherein the connections on the network device include sockets shaped to receive SFP+ plug connectors.

5. The network device of claim 1, wherein the connections on the network device include sockets shaped to receive circuit board edge connectors.

6. The network device of claim 1, wherein the engaging device comprises a handle.

7. The network device of claim 6, wherein the handle of the engaging device can be locked in a closed position.

8. The network device of claim 1, wherein the engaging device is vertically spaced from the alignment rails.

9. A network device of a server rack, comprising:
 a body having a front end, an opposite rear end and at least one pair of side surfaces extending between the front end and the rear end, the body having connectors protruding from the front end;
 alignment rails positioned on each of the pair of opposing side surfaces, respectively, the alignment rails extending from the front end toward the rear end and being shaped to slidingly engage respective alignment members of the server rack that extend horizontally within a rack space; and an engaging device attached to the body adjacent the rear end, the engaging device having a camming member with a distal engaging end movable into engagement with an opening in a side of the server rack, a proximal lever end shaped for manipulation by a user and a pivot connection connecting the camming member to the body, wherein the pivot connection is positioned between the distal engaging end and the proximal lever end of the camming member, and wherein the proximal lever end is longer than the distal engaging end to allow the user to generate leverage to move the distal engaging end and urge the connectors on the front end of the body into engagement with corresponding connections of a panel positioned in the rack space opposite the front end.

10. The network device of claim 9, wherein the engaging device is positioned below a level of the alignment rails when the network device is positioned for insertion into the server rack.

11. The network device of claim 9, wherein the alignment rails have tapered front ends, respectively, to assist in guiding the body into position in the rack space.

12. The network device of claim 9, wherein the front end comprises sockets for receiving guide pins protruding from the panel in the rack space.

13. The network device of claim 9, wherein the engaging device can be positioned in a storage position wherein the proximal end is received in a recess defined in a rear end of the body.

14. The network device of claim 13, wherein the engaging device can be locked in the storage position.

15. The network device of claim 9, wherein the connectors comprise at least one SFP+ plug connector.

16. The network device of claim 1, wherein the connectors comprise at least one socket shaped to receive circuit board edge connectors.

17. A network device of a server rack, comprising:
a body having a front end, an opposite rear end and at least one pair of opposing side surfaces extending between the front end and the rear end, the body having connectors protruding from the front end;
alignment rails positioned on each of the pair of opposing side surfaces, respectively, the alignment rails extending from the front end toward the rear end and being shaped to slidingly engage respective alignment members of the server rack that extend horizontally within a rack space; and
an engaging device attached to the body and extending from the front end, the engaging device being actuatable to engage a panel positioned stationarily in a rack space of the server rack opposite the front end of the body, wherein actuation of the engaging device causes the network device to slide along the alignment rails and urges the front end of the body into engagement with connections of the panel such that electrical connections are completed.

18. The network device of claim 17, wherein the engaging device is accessible from the rear end of the body.

19. The network device of claim 17, wherein the front end comprises sockets shaped to receive guide pins extending from the panel.

20. The network device of claim 17, wherein the engaging device is actuatable by rotation.

\* \* \* \* \*